United States Patent

Miyashita et al.

[11] Patent Number: 5,279,077
[45] Date of Patent: Jan. 18, 1994

[54] METHOD FOR PRODUCING SEMICONDUCTOR WAFER

[75] Inventors: Motoharu Miyashita; Norio Hayafuji; Yutaka Mihashi, all of Itami, Japan

[73] Assignee: Mitsubishi Denki Kabushiki Kaisha, Tokyo, Japan

[21] Appl. No.: 977,154

[22] Filed: Nov. 16, 1992

[30] Foreign Application Priority Data

Mar. 12, 1992 [JP] Japan .................................. 4-89416

[51] Int. Cl.$^5$ .................................................. B24B 49/00
[52] U.S. Cl. .................................. 51/283 E; 51/323; 51/5 C
[58] Field of Search .................................. 51/3, 5 R; 5 B; 5 C, 283 R, 283 E; 323

[56] References Cited

U.S. PATENT DOCUMENTS

| | | | |
|---|---|---|---|
| 4,896,459 | 1/1990 | Brandt | 51/5 C |
| 5,076,021 | 12/1991 | Steere, Jr. | 51/283 E |
| 5,087,307 | 2/1992 | Nomura et al. | 51/323 |
| 5,111,622 | 5/1992 | Steere, Jr. | 51/5 C |
| 5,117,590 | 6/1992 | Kudo et al. | 51/283 E |
| 5,185,956 | 2/1993 | Steere, Jr. | 51/5 C |
| 5,189,843 | 3/1993 | Steere, Jr. | 51/5 C |

FOREIGN PATENT DOCUMENTS 62-279652 12/1987 Japan .

*Primary Examiner*—M. Rachoba
*Attorney, Agent, or Firm*—Leydig, Voit & Mayer

[57] ABSTRACT

In a method for forming a semiconductor wafer with an orientation flat along a cleavage plane, a groove or hole is formed in the substrate on a line along which the substrate is cleaved to form an orientation flat and the substrate is treated to produce a mirrorlike surface. Then, the substrate having the mirrorlike surface is cleaved from the groove or hole to form the orientation flat. Accordingly, edges of the cleavage plane are not rounded due to the surface treatment. In addition, the substrate is easily cleaved along the cleavage plane from the groove or the hole. As a result, a semiconductor wafer having a sharp cleavage plane as an orientation flat is produced with improved yield, and alignment is performed with high precision in a subsequent process, such as photolithography.

5 Claims, 5 Drawing Sheets

F I G. 2 (a)
F I G. 2 (b)
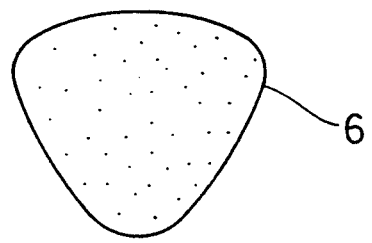
F I G. 2 (c)
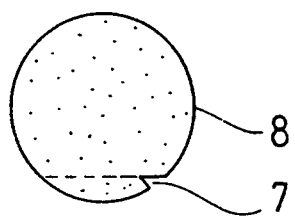
F I G. 2 (d)
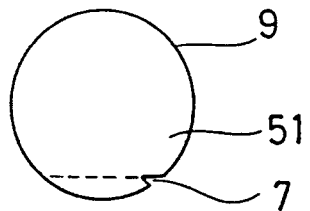
F I G. 2 (e)
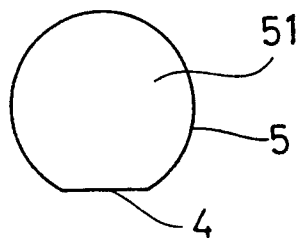

FIG. 4
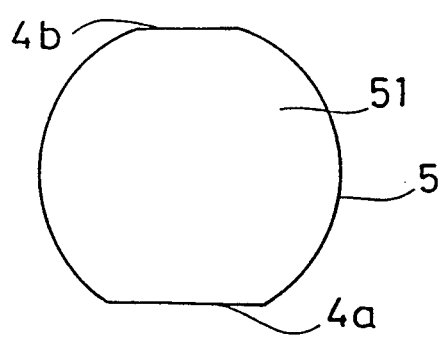
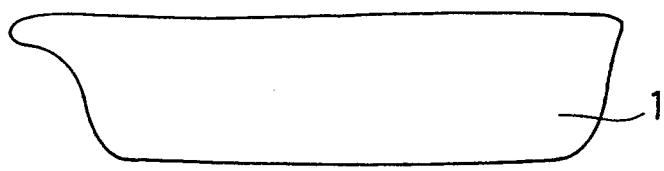
F I G. 5 (a)
(PRIOR ART)
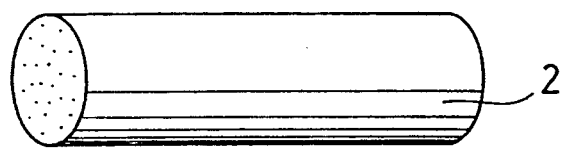
F I G. 5 (b)
(PRIOR ART)
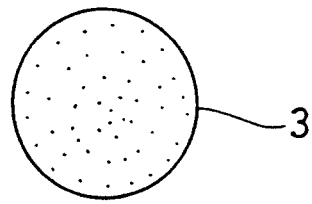
F I G. 5 (c)
(PRIOR ART)
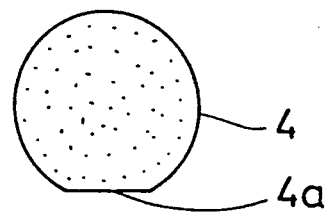
F I G. 5 (d)
(PRIOR ART)
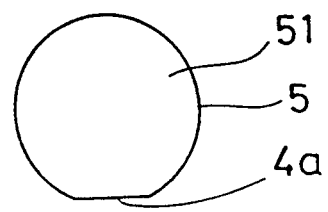
F I G. 5 (e)
(PRIOR ART)

METHOD FOR PRODUCING SEMICONDUCTOR WAFER

FIELD OF THE INVENTION

The present invention relates to a method for producing a semiconductor wafer having an orientation flat formed by cleaving a portion of the wafer along a cleavage plane. The invention also relates to a substrate used for producing the semiconductor wafer.

BACKGROUND OF THE INVENTION

FIGS. 5(a)-5(e) illustrate a method for forming a GaAs epitaxial wafer having a cleavage plane orientation flat. In these figures, reference numeral 1 designates a GaAs monocrystalline ingot. This GaAs monocrystalline ingot 1 is formed by a boat grown method in which GaAs is melted in an electric furnace and a crystalline seed is moved from a high temperature region to a low temperature region in the furnace to grow the GaAs ingot with the crystalline seed as a core. Alternatively, it may be formed by a pull method in which GaAs is melted in a crucible and the melted GaAs is slowly pulled up by a seed crystal bar. Reference numeral 2 designates a cylindrical GaAs monocrystalline ingot made of the GaAs monocrystalline ingot 1. Reference numeral 3 designates a GaAs substrate obtained by slicing the cylindrical GaAs monocrystalline ingot 3 in a prescribed thickness. Reference numeral 4 designates a GaAs wafer having an orientation flat 4a formed by cleaving a portion of the GaAs substrate 3 along a cleavage plane. Generally, the orientation flat 4a is formed at a position relating to a crystal orientation of the GaAs substrate 3 and serves as a mark when the orientation of the wafer is detected in a subsequent process. Reference numeral 5 designates a GaAs epitaxial wafer in which an epitaxial layer 51 is grown on the GaAs wafer 4.

A description is given of the production process. Initially, as illustrated in FIG. 5(a), a high quality GaAs monocrystalline ingot 1 is formed by the above-described boat grown method or the pull method. Then, as illustrated in FIG. 5(b), opposite end portions of the ingot 1 are cut off to remove deformed portions of the ingot 1. Then, the ingot 1 is formed into a cylindrical shape by polishing its periphery, whereby a diameter of a wafer to be formed is determined. Preferably, the diameter is a few inches.

Thereafter, the cylindrical GaAs monocrystalline ingot 2 is sliced using a very thin diamond blade, providing a GaAs substrate 3 shown in FIG. 5(c). When the diameter of wafer is 2 inches, it is sliced in a thickness of about 400 microns. When the diameter is 3 inches, it is sliced in a thickness of about 600 microns.

Then, as illustrated in FIG. 5(d), an end portion of the GaAs substrate 3 is cleaved along a cleavage plane to form an orientation flat 4a. Since there are differences in thicknesses of a plurality of GaAs wafers 4 with the orientation flat 4a due to the slicing process, both surfaces of the GaAs wafers 4 are lapped in a solution comprising aluminium oxide and glyceline or the like while applying pressure thereto, whereby the thicknesses of the GaAs substrates 4 are made substantially equal. Then, a disordered layer and a contaminated layer each about 10 microns thick on the surface and the periphery of the wafer 4 due to the lapping are removed by etching. Then, abrasive is dropped onto the substrate and the substrate is polished using a porous pad or the like to improve the flatness of the substrate, resulting in a mirrorlike surface of the GaAs wafer 4

Thereafter, as illustrated in FIG. 5(e), an epitaxial layer 51 is grown on the surface of the GaAs substrate 4 by MOCVD or the like, resulting in a GaAs epitaxial wafer 5 with the cleavage plane serving as the orientation flat.

FIGS. 6(a)-6(e) illustrate another conventional method for producing the GaAs epitaxial substrate with the cleavage plane as the orientation flat. In this method, after directly slicing a GaAs monocrystalline ingot, a prescribed diameter of a wafer to be formed is obtained by stamping and then an orientation flat is formed. In FIGS. 6(a)-6(e), reference numeral 6 designates a GaAs substrate for stamping obtained by directly slicing the GaAs monocrystalline ingot 1.

Initially, as illustrated in FIG. 6(a), a GaAs monocrystalline ingot 1 is formed by the boat grown method, the pull method, or the like. Then, the ingot 1 is sliced in a prescribed thickness, providing a GaAs substrate 6 shown in FIG. 6(b).

Then, as illustrated in FIG. 6(c), a GaAs substrate 3 is stamped out from the GaAs substrate 6 using a trimming die (not shown) having a diameter equal to a desired diameter of a wafer to be formed.

Then, as illustrated in FIG. 6(d), an end portion of the GaAs substrate 3 is cleaved along a cleavage plane to form an orientation flat 4a. Thereafter, lapping, etching, and polishing processes are applied to the GaAs wafer 4 with the orientation flat 4a to provide a mirrorlike surface of the GaAs wafer 4.

Then, as illustrated in FIG. 6(e), an epitaxial layer 51 is grown on the GaAs wafer 4 by MOCVD or the like, resulting in a GaAs epitaxial wafer 5 with the cleavage plane as the orientation flat.

In the above-described conventional methods, since the orientation flat is produced by cleaving the substrate along the cleavage plane, the orientation flat is produced with high precision. However, since the surface treatment like the polishing is performed after the formation of the orientation flat 4a, edges of the cleavage plane of the orientation flat are rounded as shown in FIG. 7. In addition, when the epitaxial layer 51 is grown on the wafer 4, the edges of the cleavage plane of the orientation flat 4a are also rounded due to the grown epitaxial layer 51. Therefore, when a position of the GaAs epitaxial wafer 5 is detected on the basis of the orientation flat 4a, the precision of the position detection is lowered.

In addition, when the orientation flat 4a is formed by cleaving the GaAs wafer 4, the GaAs wafer 4 is unfavorably cracked or broken, resulting in a poor production yield.

SUMMARY OF THE INVENTION

It is an object of the present invention to provide a method for forming a semiconductor wafer in which a semiconductor wafer having a sharp cleavage plane as an orientation flat is produced in a simple process with a good yield.

It is another object of the present invention to provide a substrate used for forming such a semiconductor wafer.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a method for producing a semiconductor wafer having a cleavage plane as an orientation flat, a semiconductor monocrystalline ingot is formed into a cylindrical shape, a groove is formed at the side of the cylindrical ingot in a direction parallel with a cleavage direction, the cylindrical ingot having the groove is sliced in a prescribed thickness to form a substrate for a semiconductor wafer, the surface of the substrate is treated to provide a mirrorlike surface, and the substrate having the mirrorlike surface is cleaved from the groove, resulting in a semiconductor wafer with a cleavage plane as an orientation flat.

According to a second aspect of the present invention, in a method for producing a semiconductor wafer having a cleavage plane as an orientation flat, a semiconductor monocrystalline ingot is sliced in a prescribed thickness to form a substrate, a circular substrate is stamped from the substrate, a groove or a hole is formed through the circular substrate so that the groove or hole may be on a line along which the substrate is cleaved to form an orientation flat, the surface of the substrate is treated to produce a mirrorlike surface on the substrate, and the substrate having the mirrorlike surface is cleaved from the groove or hole, resulting in a semiconductor wafer having a cleavage plane as an orientation flat.

According to a third aspect of the present invention, a substrate used for producing a semiconductor wafer having a cleavage plane as an orientation flat includes a groove or a hole through the substrate, on a line along which the substrate is cleaved to form the orientation flat.

According to the present invention, the substrate is easily cleaved from the groove or the hole, so that breakage of the substrate is significantly decreased. In addition, since the substrate is cleaved after the surface treatment, the edges of the cleavage plane are not rounded due to the surface treatment, resulting in a sharp cleavage plane as an orientation flat.

BRIEF DESCRIPTION OF THE DRAWINGS

FIGS. 2(a)-2(e) are diagrams illustrating steps in a method for producing a semiconductor wafer in accordance with a second embodiment of the present invention;

FIG. 4 is a diagram showing a semiconductor wafer having a second flat;

FIGS. 5(a)-5(e) are diagrams illustrating steps in a method for producing a semiconductor wafer in accordance with the prior art;

DETAILED DESCRIPTION OF THE PREFERRED EMBODIMENTS

Figure 1A:
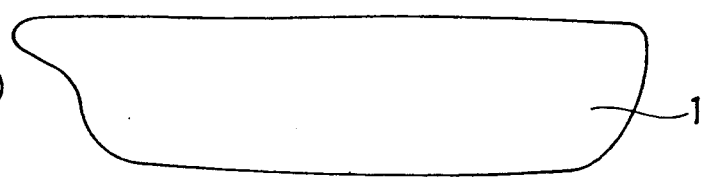
FIGS. 1(a)-1(f) are diagrams illustrating steps in a method for producing a semiconductor wafer in accordance with a first embodiment of the present invention.

FIGS. 1(a)-1(f) are diagrams illustrating steps in a method for producing a semiconductor wafer in accordance with a first embodiment of the present invention. In these figures, the same reference numerals as in FIGS. 5(a)-5(e) designate the same or corresponding parts. Reference numeral 8 designates a GaAs substrate having a V-shaped groove 7 from which the substrate 8 is cleaved to form an orientation flat. Reference numeral 9 designates a GaAs substrate on which an epitaxial layer 51 is formed.

A description is given of the production process.

Figure 1B:
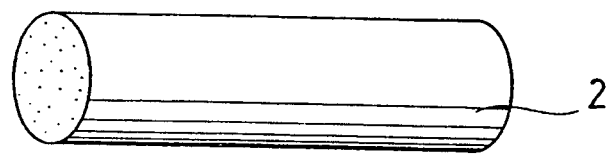

Initially, as illustrated in FIG. 1(a), a GaAs monocrystalline ingot 1 is formed by the conventional boat grown method, pull method, or the like. Then, as illustrated in FIG. 1(b), opposite end portions of the ingot 1 are cut off to remove deformed portions of the ingot 1. Then, the periphery of the ingot 2 is polished to form the ingot 2 into a cylindrical shape, whereby the diameter of a wafer to be formed is determined. Preferably, the diameter is a few inches.

Figure 1C:
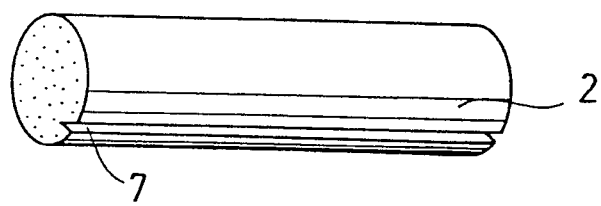

Then, as illustrated in FIG. 1(c), crystal orientation of the cylindrical GaAs monocrystalline ingot 2 is detected by X-ray analysis or the like. Thereafter, a V-shaped groove 7 having a depth of about 0.1 mm is formed at the side of the ingot 2 so that a side surface of the groove 7 aligns with a cleavage plane along which the substrate 8 is cleaved to form an orientation flat. Preferably, the groove 7 is formed by dicing o etching.

Figure 1D:
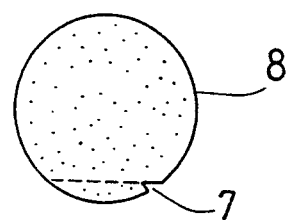

Thereafter, the GaAs monocrystalline ingot 2 with the V-shaped groove 7 is sliced using a very thin diamond blade, providing a GaAs substrate 8 shown in FIG. 1(d). When the diameter of the wafer is 2 inches, it is sliced in a thickness of about 400 microns. When the diameter is 3 inches, it is sliced in a thickness of about 600 microns.

Figure 1E:
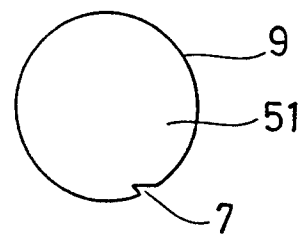

Then, a surface treatment, such as chamfering, etching, polishing or the like, is applied to the GaAs substrate 8 with the groove 7 to produce a mirrorlike surface on the GaAs substrate 8. Then, as illustrated in FIG. 1(e), an epitaxial layer 51 having a desired layer structure, for example, a laser structure is grown on the GaAs substrate 8 by MOCVD or the like, resulting in a GaAs substrate 9 with the epitaxial layer 51.

Figure 1F:
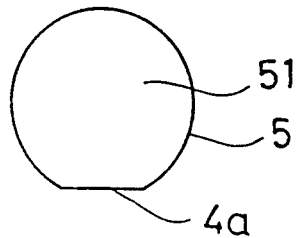

Thereafter, the GaAs substrate 9 is cleaved from the V-shaped groove 7 to form an orientation flat 4a. Thus, a GaAs epitaxial wafer 5 with the cleavage plane as the orientation flat 4a is achieved as shown in FIG. 1(f). In this case, although the epitaxial layer 51 formed on the GaAs substrate 9 is also cleaved when the GaAs substrate 9 is cleaved, since the crystalline epitaxial layer 51 is uniformly oriented the epitaxial layer 51 is not broken by a crack or the like generated in a direction different from the orientation flat 4a.

According to the first embodiment of the present invention, edges of the orientation flat 4a are not rounded due to the surface treatment and the growth of the epitaxial layer 51. In addition, the GaAs substrate 9 is easily cleaved from the groove 7, so that breakage in the GaAs substrate is significantly decreased.

FIGS. 2(a)-2(e) are diagrams illustrating steps in a method for producing a semiconductor wafer in accordance with a second embodiment of the present invention. In this method, a GaAs monocrystalline ingot is directly sliced and then a desired diameter of a wafer to be formed is obtained by stamping.

Initially, as illustrated in FIG. 2(a), a GaAs monocrystalline ingot 1 is formed by the conventional boat grown method, pull method, or the like. Then, the ingot 1 is sliced in a prescribed thickness, providing a GaAs substrate 6 shown in FIG. 2(b).

Then, as illustrated in FIG. 2(c), crystal orientation of the GaAs substrate 6 is detected by X-ray analysis or the like. Then, a GaAs substrate with a desired shape and a desired diameter is stamped out from the GaAs substrate 6 using a trimming die (not shown), ultrasonic energy, or the like. Then, a V-shaped groove 7 having a depth of about 0.1 mm is formed in the GaAs substrate so that a side wall of the groove aligns with a cleavage plane along which the substrate is cleaved to form an orientation flat. Preferably, the groove 7 is formed by dicing or etching. Thus, a GaAs substrate 8 shown in FIG. 2(d) is formed.

Then, as illustrated in FIG. 2(e), a surface treatment, such as lapping, etching, polishing or the like, is performed to the GaAs substrate 8 to produce a mirrorlike surface on the GaAs substrate 8. Thereafter, an epitaxial layer 51 having a desired layer structure, for example, a laser structure is grown on the substrate 8 by MOCVD or the like.

Thereafter, the GaAs substrate 9, on which the epitaxial layer 51 is present, is cleaved from the V-shaped groove 7 to form an orientation flat 4a. Thus, a GaAs epitaxial wafer 5 having a sharp cleavage plane of the orientation flat 4a is achieved.

According to the second embodiment of the present invention, the GaAs epitaxial wafer 5 having a sharp cleavage plane of the orientation flat is formed using the stamping method with an improved production yield.

Figure 3:
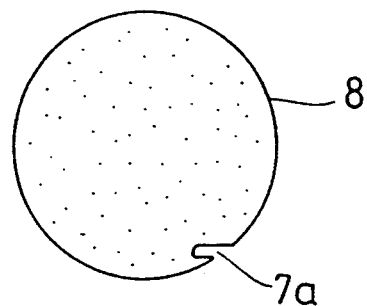
FIGS. 3(a)-3(d) are diagrams illustrating various examples of grooves and holes which are formed in a substrate in the method according to the first and second embodiments.
Figure 3:
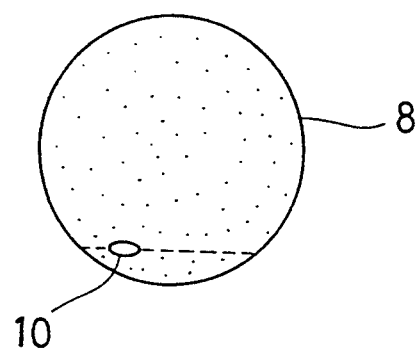
Figure 3:
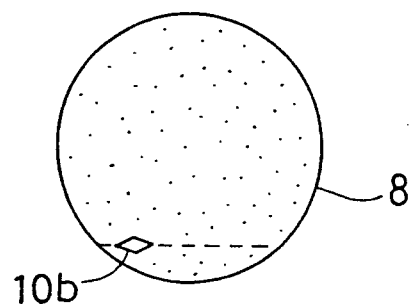
Figure 3:
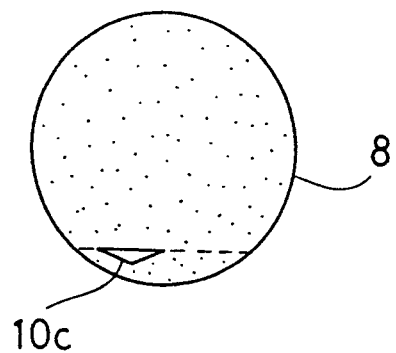
Figure 6A:
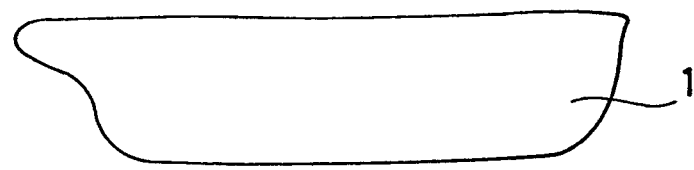
FIGS. 6(a)-6(e) are diagrams illustrating steps in a method for producing a semiconductor wafer in accordance with the prior art.
Figure 6B:
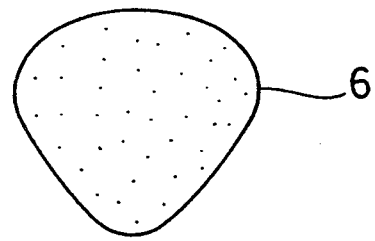
Figure 6C:
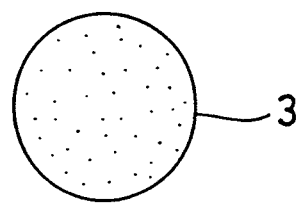
Figure 6D:
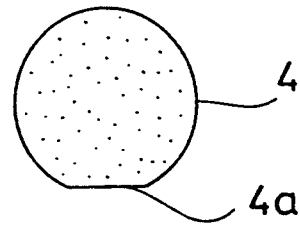
Figure 6E:
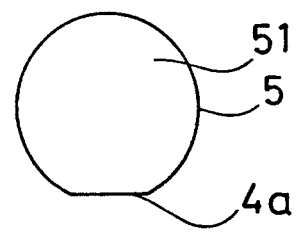
Figure 7:
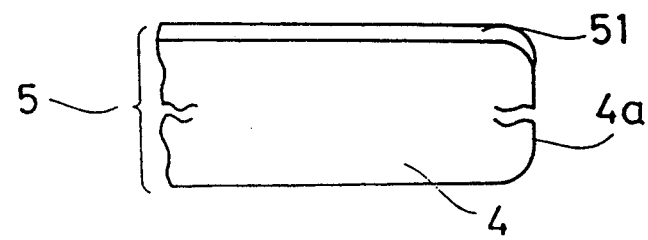
FIG. 7 is an enlarged view of a part of the prior art semiconductor wafer in the vicinity of the orientation flat.

While in the above-described first and second embodiments the V-shaped groove 7 is formed as a clue for cleaving the substrate to form the orientation flat 4a, a U-shaped groove 7a may be formed as shown in FIG. 3(a). Also in this case, a GaAs epitaxial wafer having a sharp cleavage plane as an orientation flat is formed with an improved production yield. In addition, by employing the U-shaped groove, the GaAs substrate is prevented from cracking or breaking when the GaAs ingot with the groove 7a is sliced to provide the substrate 8 or when stress is applied to the substrate 8 by handling during the surface treatment in the step before forming the epitaxial layer.

While in the above-described second embodiment the V-shaped groove 7 is formed at an end of a line along which the substrate is cleaved to form the orientation flat, an oval hole 10 shown in FIG. 3(b), a rhomboid hole 10b shown in FIG. 3(c), or a triangular hole shown in FIG. 3(d) may be formed so that a major axis thereof is aligned with the line along which the substrate is cleaved to form an orientation flat. Also in this case, a GaAs epitaxial wafer having a sharp cleavage plane as an orientation flat is formed with an improved production yield. In addition, the GaAs substrate is prevented from cracking or breaking when the GaAs ingot with the hole 10, 10b, or 10c is sliced to provide the GaAs substrate or when stress is applied to the GaAs substrate by handling during the surface treatment in the step before forming the epitaxial layer.

In the above-described first and second embodiments, the GaAs epitaxial wafer 5 is formed by growing the epitaxial layer 51 on the GaAs substrate 8. However, if the GaAs substrate 8 is cleaved from the groove or the hole after the surface treatment of the substrate 8 without growing the epitaxial layer 51 thereon, a GaAs wafer with a sharp cleavage plane as an orientation flat is achieved.

In the above-described first and second embodiments, the orientation flat 4a relating to crystal orientation (first flat) is formed on the wafer. As shown in FIG. 4, a second flat 4b which is smaller than the first flat 4a and reveals the conductivity type of the wafer may be formed in addition to the first flat 4a.

While in the first and second embodiments the GaAs wafer is described, other compound semiconductor materials like InP may be used with the same effects as described above.

In addition, while in the first and second embodiments the GaAs substrate 8 is formed in a circle, it may be formed in an oval or in a shape obtained by removing a portion of a circle along a prescribed arc.

As is evident from the foregoing description, according to the present invention, when a substrate for a semiconductor wafer is formed, a groove or a hole is formed through the substrate on a line along which the substrate is cleaved to form an orientation flat, the surface of the substrate is treated to produce a mirrorlike surface, and then the substrate having the mirrorlike surface is cleaved at the groove or hole to form the orientation flat. Therefore, edges of the cleavage plane are not rounded due to the surface treatment. In addition, the substrate is easily cleaved along the cleavage plane at the groove or the hole. As the result, a semiconductor wafer having a sharp cleavage plane as an orientation flat is produced with improved yield, and an alignment is performed with high precision in a subsequent process, such as a photolithography.

What is claimed is:

1. A method for producing a semiconductor wafer having a cleavage plane serving as an orientation flat comprising:
   forming a semiconductor monocrystalline ingot into a cylindrical shape;
   forming a groove at a side of said cylindrical ingot in a direction parallel to a cleavage direction;
   slicing said cylindrical ingot having said groove in a prescribed thickness to form a substrate;
   producing a mirrorlike surface on said substrate; and
   cleaving said substrate at said groove to produce a semiconductor wafer having an orientation flat along a cleavage plane of said water.

2. A method for producing a semiconductor wafer having a cleavage plane serving as an orientation flat comprising:
   slicing a semiconductor monocrystalline ingot in a prescribed thickness to form a slice;
   stamping out a circular substrate from said slice;
   forming one of a groove and a hole in said circular substrate on a line along which said substrate is to be cleaved to form an orientation flat;
   producing a mirrorlike surface on said substrate; and
   cleaving said substrate at said groove or hole to produce a semiconductor wafer having an orientation flat along a cleavage plane of said wafer.

3. The method of claim 1 including growing an epitaxial layer on said mirrorlike surface of said substrate.

4. The method of claim 2 including growing an epitaxial layer on said mirrorlike surface of said substrate.

5. The method of claim 1 including detecting crystalline orientation of said cylindrical semiconductor monocrystalline ingot by x-ray analysis and removing a prescribed portion of said ingot by dicing or etching along a detected crystalline orientation direction.

* * * * *